(12) United States Patent
Park et al.

(10) Patent No.: US 7,538,991 B2
(45) Date of Patent: May 26, 2009

(54) HALF WAVE EXPULSION (NON-FAULT CURRENT LIMITING) TYPE SUPERCONDUCTING FAULT CURRENT LIMITER HAVING INTEGRAL HIGH SPEED SWITCH MODULE

(75) Inventors: Kwon-bae Park, Deajeon (KR); Bang-wook Lee, Chungcheongbuk-do (KR)

(73) Assignee: LS Industrial Systems Co., Ltd., Seoul (KR)

( * ) Notice: Subject to any disclaimer, the term of this patent is extended or adjusted under 35 U.S.C. 154(b) by 389 days.

(21) Appl. No.: 11/611,757

(22) Filed: Dec. 15, 2006

(65) Prior Publication Data

US 2008/0103051 A1    May 1, 2008

(30) Foreign Application Priority Data

Oct. 25, 2006    (KR) .................... 10-2006-0104194

(51) Int. Cl.
*H02H 3/00*    (2006.01)
(52) U.S. Cl. ............................. 361/19; 361/2
(58) Field of Classification Search .............. 361/2, 361/12, 14, 19; 505/220
See application file for complete search history.

(56) References Cited

U.S. PATENT DOCUMENTS

| | | | | |
|---|---|---|---|---|
| 4,700,257 A | * | 10/1987 | Bekhaled | 361/19 |
| 5,021,914 A | * | 6/1991 | Tsurunaga et al. | 361/19 |
| 5,617,280 A | * | 4/1997 | Hara et al. | 361/19 |

* cited by examiner

*Primary Examiner*—Danny Nguyen
(74) *Attorney, Agent, or Firm*—Lee, Hong, Degerman, Kang & Waimey (57) ABSTRACT

Disclosed is a half-wave expulsion type superconducting fault-current limiter having an integral high speed switch module. The fault-current limiter has minimum superconducting elements and a circuit of which is formed in a hybrid type with an integral high speed switch module. The fault-current limiter supplies an electric power supplied from a power feeder to a system without loss thereof according to unique characteristics of the superconducting element when a normal current flows, and restricts an over current through a high speed switching contact point integrally inter-working with a driving coil and an arc changeover switch past a half period in a case that the over-current is generated by accidents such that electric power appliances, including circuit breakers in an electric power system, can be normally operated.

6 Claims, 7 Drawing Sheets

FIG. 1

PRIOR ART

FIG. 2

PRIOR ART

HALF WAVE EXPULSION (NON-FAULT CURRENT LIMITING) TYPE SUPERCONDUCTING FAULT CURRENT LIMITER HAVING INTEGRAL HIGH SPEED SWITCH MODULE

CROSS-REFERENCE TO RELATED APPLICATION

This application claims the benefit of Korean Patent Application No. 10-2006-0104194 filed on Oct. 25, 2006, in the Korean Intellectual Property Office, the disclosure of which is incorporated herein by reference.

BACKGROUND

This description relates to a half wave expulsion-(non-fault current limiting) type superconducting fault current limiter having an integral high speed switch module.

Current limiters and circuit breakers in an electric power system are applied to prevent an over-current more than a threshold value generated by accidents such as thunder-stroke, earth fault, short circuit, etc from flowing into the system.

Of all the current limiters, FCLs (Fault Current Limiters), which use superconducting elements, supply an electric power supplied from a power feeder to a system without loss due to unique characteristic of the superconducting elements, and restrict an over-current more than a threshold value generated by accidents such as thunder-stroke, earth fault, short circuit, etc.

Thus, the FCLs restrict a mechanical, thermal and electrical stress caused by electric power appliances such as a bus-bar, an insulator and a circuit breaker, etc.

On the other hand, a circuit breaker connected to an electric power system detects an over-current more than a threshold value, breaks the connection with the system in accordance with control of an over-current relay generating a breaking signal and thus prevents the over-current from flowing into the system.

Figure 1:
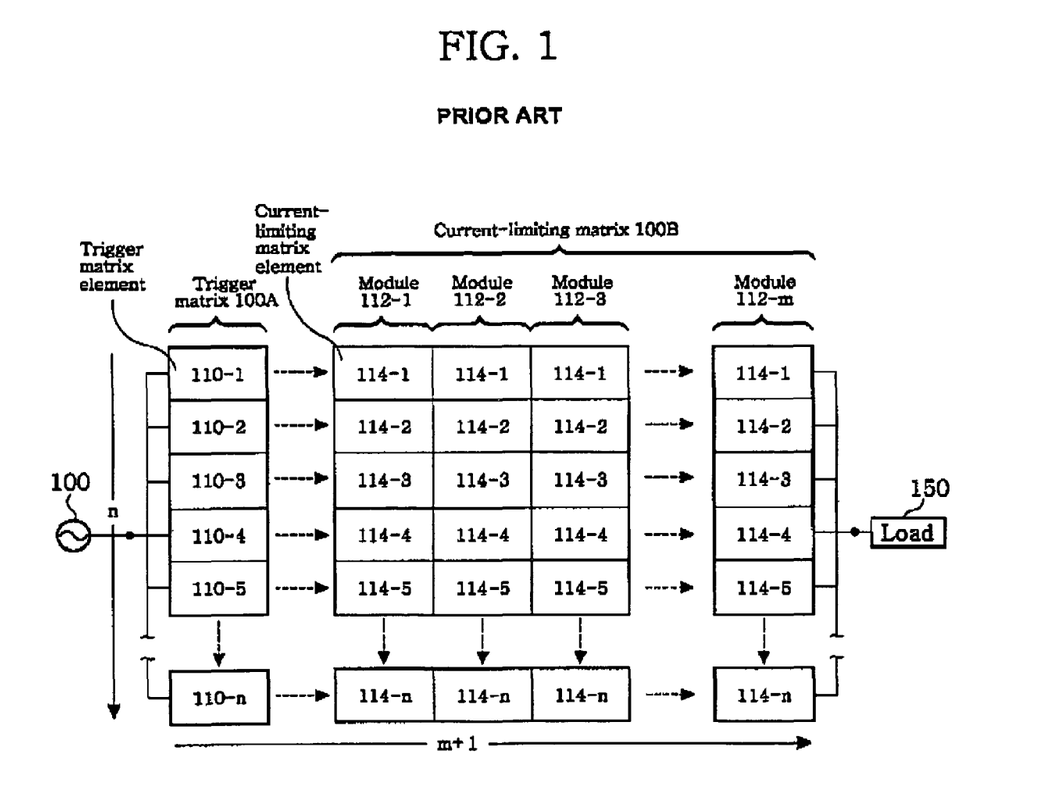
FIG. 1 shows a schematic diagram illustrating a connected state of superconducting elements in accordance with an electric power capacity in a superconducting fault current limiter.

Hereinafter, an FCL in accordance with related art will be described in detail with reference to accompanying drawings. FIG. 1 shows a connected state of superconducting elements in accordance with an electric power capacity in superconducting fault-current limiters, and FIG. 2 shows a detailed part of FIG. 1.

Figure 2:
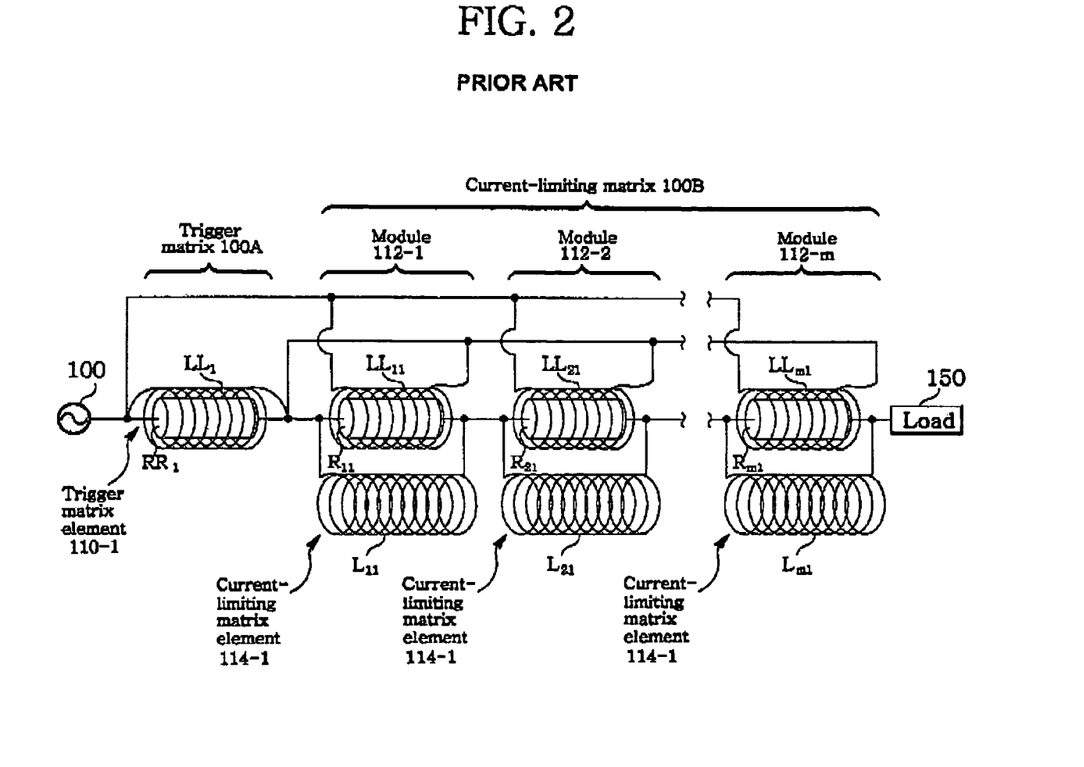
FIG. 2 shows a detailed part of FIG. 1.

Referring to FIG. 1, the conventional FCL includes a trigger matrix 100A for generating and supplying a magnetic field in order to induce concurrent quench of superconducting elements corresponding to a series connection of each row in case of generation of an over-current more than a threshold value caused by accidents such as thunder-stroke, earth fault, short circuit, a current limit matrix 100B for restricting the over-current more than the threshold value generated by accidents such as thunder-stroke, earth fault, short circuit, etc As shown in FIG. 2, the trigger matrix 100A comprises n number of trigger matrix elements 110-1 through 110-$n$ formed in accordance with current capacity required by an electric power system, wherein the respective trigger matrix elements include a superconducting element RR1, a coil LL1 surrounding the superconducting elements RR1.

As in FIG. 2, the current limit matrix 100B comprises n number of current limit matrix elements 114-1 through 114-$n$ connected to the trigger matrix element 110-1, wherein the respective current limit elements include a superconducting element RR1, a coil LL1 surrounding the superconducting elements RR1 and a coil LL1 connected in parallel to the coil LL1. In addition, the current limit matrix 100B is serially connected to m number of current limit modules (Module 112-1 through 112-$m$), wherein the respective current limit modules are n number of the current limit matrix elements 114-1 through 114-$n$.

Therefore, in FCLs applied to an electric power system, n number of the trigger matrix elements 110-1 through 110-$n$ formed in accordance with a current capacity required by an electric power system are connected to n number of the current limit matrix elements 114-1 through 114-$n$ connected to n number of the trigger matrix elements 110-1, n number of the current limit matrix elements 114-1 through 114-$n$ become respectively current limit modules (Module 112-1 through 112-$m$) and m number of the current limit modules (Module 112-1 through 112-$m$) are serially connected in accordance with a voltage capacity required in an electric power system. That is, superconducting elements included in a trigger matrix element and a current limit matrix element are serially and in parallel connected in accordance with the current capacity required in the electric power system.

As in FIG. 2 showing a detailed part of FIG. 1, the superconducting element RR1 and the trigger matrix element 110-1 of the coil LL1 surrounding the superconducting elements RR1 are connected to an electric power line that receives an electric power from a power feeder 100. The current limit matrix elements 114-1 include the superconducting element RR1, a coil L11 surrounding the superconducting elements RR1 and a coil LL11 connected in parallel to the superconducting element RR1, a coil L11 surrounding the superconducting elements RR1, and m number of the current limit matrix elements 114-1 through 114-$m$ are serially respectively connected in accordance with a voltage capacity. The trigger matrix element 110-1 is connected in parallel to m number of the current limit matrix elements 114-1 through 114-$m$ in accordance with a current capacity required by an electric power system.

Referring to FIG. 2, superconducting elements (RR1, R11, R21, . . . Rm1) supply an electric power supplied from a power feeder to a system without loss of the electric power in a case that a stationary current flows thereinto. In case of the stationary current, inductance elements generated in coils (LL1, LL11, LL21 . . . LLm1) surrounding respective superconducting elements are offset.

On the other hand, when an over current more than a threshold value generated by accidents such as thunder-stroke, earth fault, short circuit, etc, the superconducting element RR1 generates a high resistance value, being quenched in a phase transition state.

The over current flows into the coil LL1 surrounding the superconducting element RR1 by the generated resistance value and thus a magnetic field is generated. Herein, this magnetic field is simultaneously supplied to coils LL11 through LLm1 serially connected. A high resistance value is generated in a case that the superconducting elements R11 through Rm1 are quenched by the magnetic field and thus the superconducting elements R11 through Rm1 distribute the over current into the coils L11 through Lm1 connected in parallel to the superconducting elements R11 through Rm1. In conclusion, the superconducting elements R11 through Rm1 are not destroyed by the over-current, such that the over-current is restricted by an impedance value included in the coils L11 through Lm1 to block an influx of the over-current into a system 150.

For the operation thus described, respective superconducting elements should be manufactured to have the same characteristic and cooled by being surrounded by refrigerants such as liquid nitrogen, etc.

As described above, superconducting elements of the FCLs are transmitted to a phase transition state by an over-current or a temperature more than a threshold value, whereby a high resistance is generated to restrict the over-current. In addition, the superconducting elements of the FCLs are restored to a superconducting state by being cooled to a temperature of superconducting state through a cooling device.

However, the superconducting elements of FCLs suffer from drawbacks in that the elements have a low acceptable electric power capacity per unit length, and thus serial and parallel connections are required for being applied to an electric power system, and an increase in serial and parallel connections of superconducting elements by geometric progression is required in a high voltage electric power system. As such being the case, the increase of connection points in accordance with serial and parallel connections of superconducting elements causes instability of FCLs, thereby disabling a safe electric power to be supplied to the electric power system. Another drawback is that the FCLs cannot be applied to a real electric power system because of a high manufacturing cost and a complicated technique for the serial and parallel connections of superconducting elements. Still another drawback is that cooling costs and techniques for maintaining a superconducting state of FCLs bar an actual application to the electric system.

There may still be further drawback in that, because a considerable time is required for restoration from a phase transition to a superconducting state, a re-closing circuit condition required in a general electric power system within a second is difficult to be satisfied.

Meanwhile, whereas 3 to 5 periods are required in a circuit breaker for breaking an over-current more than a threshold value in response to a control of an over-current relay, the FCLs restricts the over-current upon detection of the over-current which is more than the threshold value according to a unique characteristic of superconducting elements. The over-current relay detects an over-current exceeding a threshold value and transmits a cut-off signal to a breaker, but if the FCLS restricts the over-current before the over-current relay detects the over-current, the over-current relay cannot normally operate and control the breaker.

SUMMARY

Accordingly, it is an object of the present invention to provide a half wave expulsion (non-fault current limiting) type superconducting fault current limiter having an integral high speed switch module that enables itself to smoothly inter-work with system protection elements by not completely restricting a short circuit current during a half period but restricting the short circuit current past a half period for a harmonious inter-connection between the superconducting fault current limiter and system protection relay elements in case of occurrence of a short circuit. The reason is that it is desirable that an accident current should not be restricted during a half period in case of being inter-worked with protection relay elements of an electric power system even though there is a disadvantage of the superconducting fault current limiter allowing the accident current of a half period, compared with a fault current limiter limiting the current before reaching a crest value of the accident current within an initial half period following generation of the accident current.

Another object is to provide a half wave expulsion (non-fault current limiting) type superconducting fault current limiter having an integral high speed switch module that comprises only three parts of a superconducting element, a high speed switch module and a current limiting load in terms of a total configurational aspect by forming as a module integrally concurrently activated by one mechanism a number of peripheral switching elements surrounding superconducting elements in forming the fault current limiter using superconducting elements. Therefore, use and cooling cost of the superconducting elements can be reduced.

Still another object is to provide a half wave expulsion (non-fault current limiting) type superconducting fault current limiter having an integral high speed switch module capable of coping with re-closing problem and interaction with protection devices applied in an existing power electric system, and to further provide a superconducting fault current limiter usable in an electric power system accommodating an extra high voltage and a high current capacity by which reliability can be established in the long term.

In one general aspect, a half wave expulsion (non-fault current limiting) type superconducting fault-current limiter comprises an integral high speed switch module, the module further comprising: a driving coil arranged on a current-dividing path connected in parallel to superconducting elements on a power supply path for generating an electronic repulsive force when an over-current divided by quench of superconducting elements is applied and then supplying same to inter-working means; a high speed switching contact point connected in series between the driving coil and a system, located on a rear terminal of the current dividing path, and integrally axially coupled to the inter-working means to allow a contact point contacting the switch to be opened by an electronic repulsive force supplied to the inter-working means; and an arc changeover switch arranged on a current limit path by being connected in parallel to the driving coil, and one side of which is integrally and axially coupled to the inter-working means, while being inter-worked in a moving direction and an opposite direction of the high speed switching contact point, and supplying the over-current to a current limit load connected in series to a rear terminal thereof through the contact point when the high speed switching contact point is opened as much as a predetermined interval.

The integral high speed switch module may be consecutively and sequentially arranged in at least one or more numbers in mechanical terms of view, and more particularly, the high speed switching contact point may be consecutively and sequentially arranged in at least one or more numbers, and preferably, the driving coil may be arranged on one or more current-dividing paths if the high speed switching contact point is arranged in plural numbers.

Now, the half wave expulsion (non-fault current limiting) type superconducting fault-current limiter having an integral high speed switch module thus configured according to the present invention will be described in detail with reference to the accompanying drawings.

Detailed descriptions of well-known functions, configurations or constructions are omitted for brevity and clarity so as not to obscure the description of the present invention with unnecessary detail. Hereinafter, the terms of "expulsion" and "non-fault current limiting" may be alternatively and/or independently used for convenience sake.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION

Figure 3:
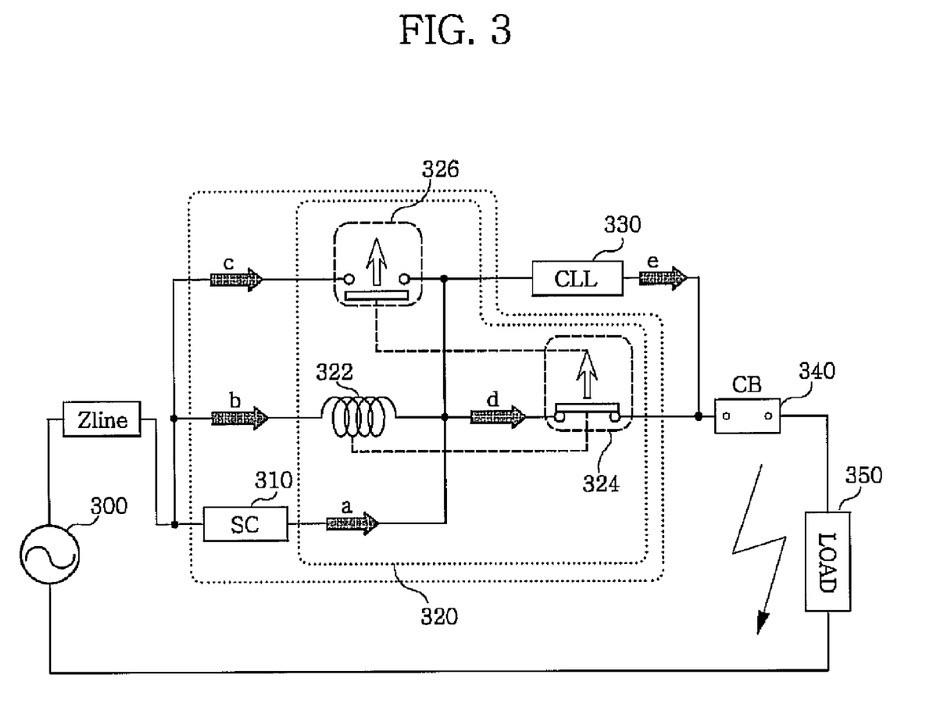
FIG. 3 shows one exemplary embodiment of a half-wave expulsion (non-fault current limiting) type superconducting fault current limiter having an integral high speed switch module.
Figure 4:
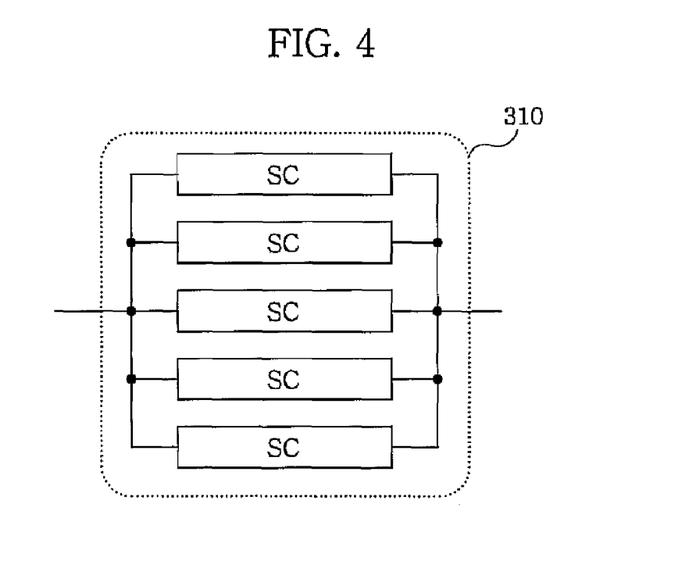
FIG. 4 shows a connected state of superconducting elements in FIG. 3.
Figure 5:
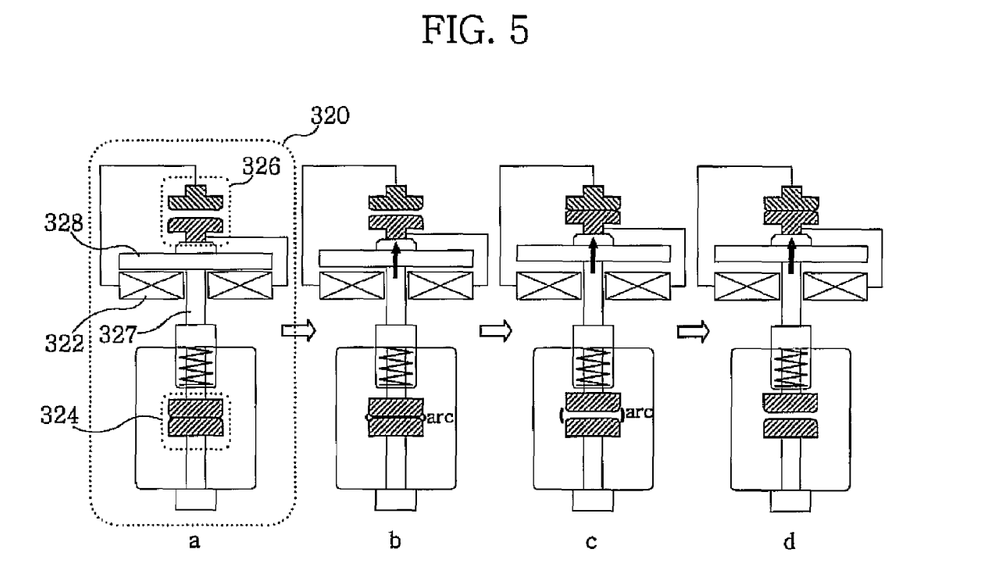
FIG. 5 shows a detailed operation of an integral high speed switch module of FIG. 3.
Figure 6:
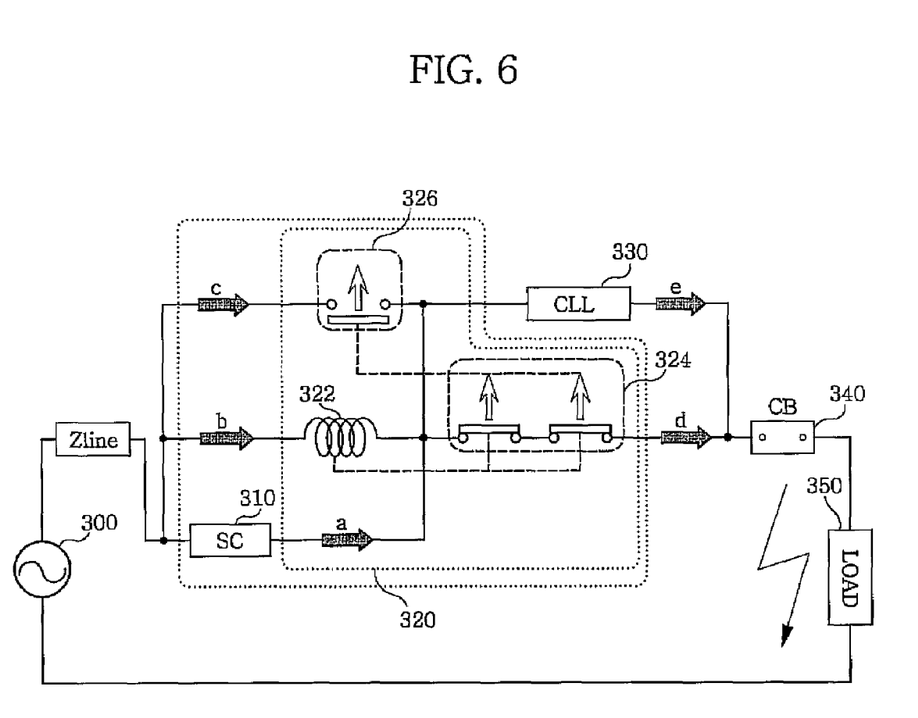
FIG. 6 shows a schematic view of an exemplary embodiment of FIG. 3.

FIG. 3 shows one exemplary embodiment of a half-wave non-fault current limiting type superconducting fault current limiter having an integral high speed switch module, FIG. 4 shows a connected state of superconducting elements in FIG. 3, FIG. 5 shows a detailed operation of an integral high speed switch module of FIG. 3, and FIG. 6 shows a schematic view of an exemplary embodiment of FIG. 3.

Referring to FIG. 3, a superconducting element 310 is connected in series to an electric power line having a predetermined impedance value for optimizing transfer characteristics of an electric power supplied from a power feeder 300.

An integral high speed switch module 320, a current limit load 330, and a circuit breaker 340 are connected to a rear end of the superconducting element (indicated in dotted lines to show integrity thereof).

The integral high speed switch module 320 comprises: a driving coil 322 connected in parallel to the superconducting element 310 on a current-dividing path formed to divide an over-current i.e., an accident current, in a case that quench of the superconducting element 310 is generated in a circuit; a high speed switching contact point 324 connected in series between the driving coil 322 and a system 350 by having its contact point contacted at all times; and an arc changeover switch 326 connected in parallel between both ends of the driving coil 322 by having its contact point opened at all times on a current limit path. Mechanically as depicted in a dotted lines of FIG. 5, an axis 327 is extensively coupled with a repulsive plate 328 moved by the driving coil 322, the high speed switching contact point 324 is formed at both distal lower ends of the axis, and the arc changeover switch 326 is formed at an upper side of both ends, wherein the high speed switching contact point 324 and the arc changeover switch 326 are oppositely arranged in an ON/OFF switch concept, Operation of the integral high speed switch module 320 will be described in detail with reference to FIGS. 5a to 5d.

The superconducting element 310 comes to be in a superconduction state where an electric resistance value is 0Ω within a three-kind threshold value such as critical current density (Jc), critical magnetic field (Hc) and critical temperature (Tc).

The superconducting element 310 supplies an electric power supplied from a power feeder 300 to a system 350 without loss of the electric power using the superconducting state. In addition, the superconducting element 310 is transmitted from a superconduction state to a phase transition state at a high speed and instantly creates a quench phenomenon causing generation of a high resistance value if any one of those three threshold values exceeds a predetermined level.

In a case that an over-current more than a threshold value flows into itself by an accident such as thunder-stroke, earth fault, short circuit, etc, a quench causing the generation of a high resistance is generated and thus the over-current is diverted to a different path. Because the over-current is diverted to a different path in case of the generation of the over-current, a plurality of the superconducting elements 310 may be connected to each other according to a current capacity required in an electric power system. For example, this exemplary connection is depicted in FIG. 4.

The superconducting element 310 is cooled surrounded with liquid nitrogen and the like in a container.

In a case that an over-current more than a threshold value flows into the superconducting element 310 by accidents such as thunder-stroke, earth fault, short circuit, etc, the integral high speed switch module 320 separates the over-current from the superconducting element 310 using the over-current, and enables the separated over-current to be current-limited.

As depicted in FIG. 5a, the integral high speed switch module 320 integrally comprises: a driving coil 322; a high speed switching contact point 324; and an arc changeover switch 326.

The high speed switch module 320 has a Vacuum Interrupter structure (VI) in which a constantly-contacted contact point of the high speed switching contact point 324 is opened in vacuum and a constantly-opened contact point of the arc changeover switch 326 is contacted in a vacuum.

The driving coil 322 of the high speed switch module 320 is arranged on a dividing path connected in parallel to the superconducting element 310, and the over current divided or separated from the superconducting element 310 flows into the driving coil 322 and thus an electronic repulsive force is generated.

The high speed switching contact point 324 of the high speed switch module 320 is serially connected between the driving coil 322 located on a rear end of the dividing path and a system 350, and its constantly-contacted contact point is opened by an electronic repulsive force of more than a threshold value generated by the driving coil 322 to generate an arc.

For example, as illustrated in FIG. 5b, an eddy current is induced and thus an electronic repulsive force is generated in the event that an over-current flows into the driving coil 322 of the high speed switch module 320, and a repulsive plate 328, which is inter-working means, is moved in an arrow direction according to the electronic repulsive force. Herein, the repulsive plate 328 can be manufactured by a conductor having a high conductivity like copper or aluminum.

At this time, one of the contact surfaces of a contacted contact point in the high speed switching contact point 324 is connected to the repulsive plate 328, and the contacted contact point starts to open the moment the repulsive plate 328 moves to generate an arc. At least one or more high speed switching contact points 324 may be sequentially and serially connected for use.

Dielectric strength, which defines a highest voltage available without use of dielectric breakdown, as depicted in FIG. 6, may be increased by sequentially and serially connecting two high speed switching contact points 324 to each other, and as a result, an acceptable voltage capacity increases. That is, the more the number of serially-connected high speed switching contact points 324 increases, the more the voltage capacity that is accommodated increases.

In addition, as shown in FIG. 5c, an arc changeover switch 326 of the high speed switch module 320 is arranged on a current limit path connected in parallel to the driving coil 322, and the contacted contact point of the high speed switching contact point 324 is gradually detached to allow the opened contact point to get contacted when reaching a point of a predetermined interval.

For reference, the current limit path defines a path where an accident current divided or separated by quench in the superconducting elements is current-limited by a current limit load, and the dividing path means a path where the accident current separated by the quench in the superconducting elements flows.

A connection time of 'c' path is determined by a contact point interval from the arc changeover switch 326, and if the contact point of the arc changeover switch 326 is contacted (FIG. 3), an over current flows into the 'c' path having a low impedance element. That is, through contact of contact point of the arc changeover switch 326, most of the over currents are separated from the superconducting element 310 and thus the superconducting element 310 is protected against the over-current. On the other hand, arc generated from the arc changeover switch 326 is continuously maintained, where a current-conducting path in which the over current flows into the system 350 by the arc is generated.

Referring to FIG. 5d, the arc generated from the arc changeover switch 326 is extinguished when it comes to a current null point in a half period of an electric power, and the current conducting path generated from the arc changeover switch 326 is disconnected.

The current limit load 334 comprises impedance elements such as resisters, inductors and condensers, etc, and restricts the over current in accordance with a previously calculated impedance value. If the arc generated by the high speed switching contact point 324 is extinguished when it becomes a current null point in a half period of the electric power, the over current flows into the current limit load 334 which in turn restricts the over-current.

The circuit breaker 340 serves to break the connection with the system 350 according to a breaking signal generated by an over current relay (not shown) in case of generation of over-current of more than a threshold value. The over-current relay (not shown) detects the over-current of more than the threshold value by being connected to the electric power system and protects electric power appliances against the over-current by generating the breaking signal. The system 350 comprises at least one or more loads using an electric power supplied from the power feeder 300.

As described above, the integral high speed switch module 320 includes a driving coil 322 for generating an electronic repulsive force by inflow of over-current, a high speed switching contact point 324 for having a contact point opened by the electronic repulsive force, and an arc changeover switch 326 for being turned on in a case the high speed switching contact point 324 is opened in a predetermined interval. Herein, the operation of the integral high speed switch module 320 is performed within a half period corresponding to a frequency of an electric power supplied from the power feeder 300. The operation speed is faster than the conventional circuit breakers for breaking an over-current within 3-5 periods However, because the high speed switching contact point 324 of the high speed switching module 320 is arranged at a rear end of the dividing path, the contact point of the high speed switching contact point 324 is opened by an electronic repulsive force generated by the driving coil 322 and arc is simultaneously generated, whereby the current conducting path in which the over-current flows into the system 350 by the generated arc is generated.

The arc element generated by the high speed switching contact point 324 is extinguished in a case that it reaches a current null point in a half period of electric power, and as a result, the current conduction path is disconnected to cause all the over current to be current-limited at the current limit load 330.

That is, the high speed switching contact point 324 of the high speed switching module 320 is arranged at a rear end of the dividing path in order that the over current is current-limited at the current limit load 330. This is one of the important reasons to come to call this concept a half wave non-fault time limiting type.

This is one of the important objects of the present invention that enables protect devices such as the circuit breaker 320 applied an to electric power system to interact with each other.

In a nutshell, the arrangement of the high speed switching contact point 324 of the high speed switching module 320 at a rear end of the dividing path makes it possible for a superconducting current limiter to define a half wave non-fault current limiting type superconducting fault current limiter according to the present invention.

Now, referring back to FIG. 3, typically, the superconducting element 310 supplies an electric power supplied from the power feeder 300 to the system 350 through 'd' path via 'a' path without loss of the electric power.

The quench phenomenon generating a high resistance value arises in the superconducting element 310 in case of generation of an over current more than a threshold value according to accidents such as thunder-stroke, earth fault, short circuit, and the over current generated by the high resistance flows into the driving coil 322 of 'b' path (dividing path) connected in parallel connected to the superconducting element 310.

An eddy current is induced by the over current flowing into the driving coil 322 and thus a strong electronic repulsive force is generated, and the contacted contact point of the high speed switching contact point 324 serially connected to the driving coil 322 is opened by the electronic repulsive force.

If the contact point of the high speed switching contact point 324 is detached, an arc is generated and an over current is restricted by resistance of the generated arc as much as a predetermined value. However, a current conduction path is generated by the arc to cause the over current to flow through 'd' path The contact point of the arc changeover switch 326 is contacted to cause the over current to flow into 'c' path (current limit path) in a case that the high speed switching contact point is opened as much as a predetermined interval.

The arc generated from the high speed switching contact point 324 is extinguished in a case the over current reaches a half period or a current null point, where the superconducting element 310 is completely separated from the over current at the same time. All the over-current is divided into the current limit load 330 connected in parallel to the high speed switching contact point 324 and thus is restricted to a value calculated by the current limit load 330 from after a half period of the electric power. The circuit breaker 340 turns on its switch according to a breaking signal generated by an over current relay and then disconnects the connection with the system 350.

Such being the case, the superconducting element 310 supplies the electric power supplied from the power feeder 300 to the system 350 without loss of the electric power, generates a high resistance value and thus divides the over current into different paths in case of generation of over current of more than a threshold value in response to accidents such as thunder-stroke, earth fault, short: circuit, etc.

In addition, the integral high speed switch module 320 protects the superconducting element 310 by separating the over-current from the superconducting element 310 and enables the over current to be restricted from after a half, period of the electric power.

Thus, the superconducting elements 310, as depicted in FIG. 4, are connected in parallel according to a current capacity required by the electric power system.

That is, a safe and reliable half-wave non-fault current limiting type superconducting limiter can be embodied by employing a superconducting element separate from a voltage capacity of the electric power system and application of minimum superconducting elements.

In addition, the half-wave expulsion (non fault current limiting) type superconducting fault-current limiter can harmonize with electric power appliances such as circuit breakers and the like on the power system by restricting the over current after a half period to enable the power appliances to operate.

In addition, the half-wave expulsion type superconducting fault-current limiter can be utilized to the purpose because it suffices that superconducting elements are connected in parallel according to a current capacity required by an electric power system, and if superconducting elements are also connected in parallel to meet the required current capacity in a large electric power system and electric power appliances are replaced according to a voltage capacity, the half-wave expulsion type superconducting fault-current limiter can be usefully utilized.

Figure 7:
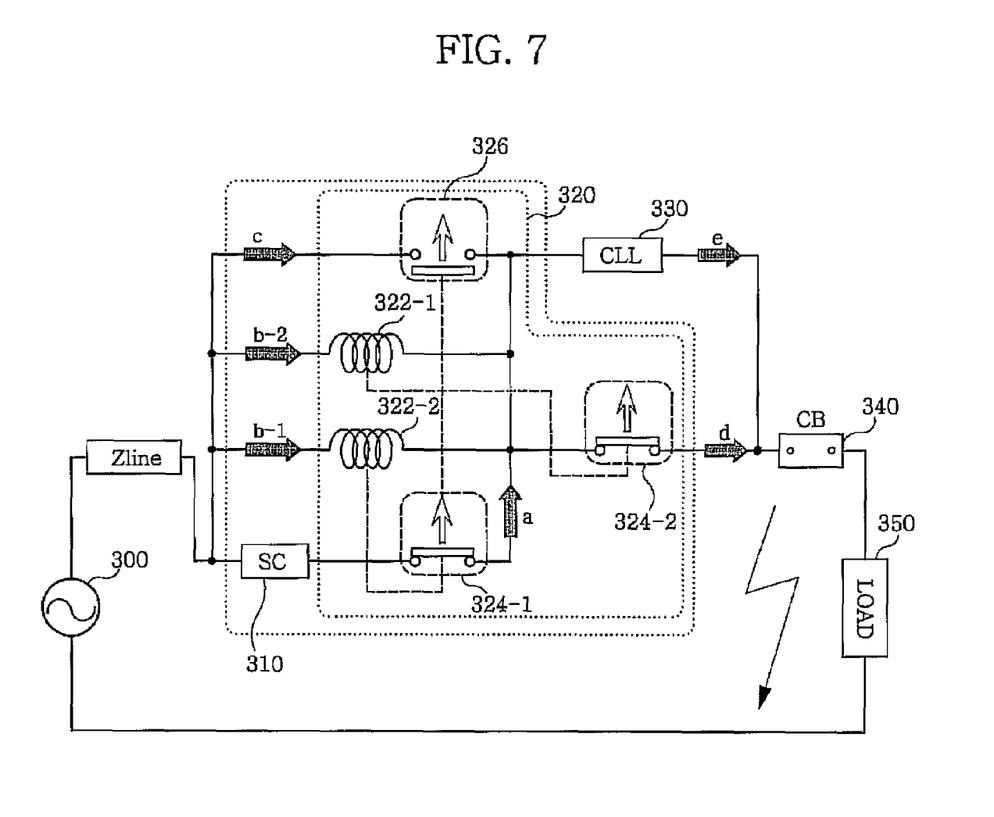
FIG. 7 shows another exemplary embodiment of a half wave non-fault current limiting type superconducting fault-current limiter having an integral high speed switch module.

FIG. 7 shows another exemplary embodiment of a half wave expulsion (non-fault current limiting) type superconducting fault-current limiter having an integral high speed switch module.

Referring to FIG. 7, the superconducting element 310 is serially connected to an electric power line having a predetermined impedance value in order to optimizing transfer characteristics of the electric power supplied from the power feeder 300. The half-wave expulsion type superconducting fault-current limiter having an integral high speed switch module comprises an integral high speed switch module 320, wherein the integral high speed switch module 320 includes a first high speed switching contact point 324-1 for being serially connected between the superconducting element 310 and a system 350 on a power supply path and having its contact point always connected, a first driving coil 322-1 for being connected in parallel to the superconducting element 310 and the first high speed switching contact point 324-1 on a first dividing path, a second driving coil 322-2 for being connected in parallel to the first driving coil 322-1 on a second dividing path, a second high speed switching contact point 324-2 for being serially connected between the second driving coil 322-2 and the system 350 and having its contact point always connected, and an arc changeover switch 326 for being connected in parallel to the second driving coil 322-2 and having a contact point always opened on a current limit path In addition, a current limit load is connected between the first driving coil 322-1, the second driving coil 322-2 and the arc changeover switch 326 to form a half-wave expulsion type superconducting fault-current limiter. And the half-wave expulsion type superconducting fault-current limiter is connected to the system 350 through the circuit breaker 340. Now, a comparison is made between FIG. 7 and FIG. 3. It can be noted that the half-wave expulsion type superconducting fault-current limiter further comprises the integral high speed switch module 320 including the first high speed switching contact point 324-1 serially connected to the superconducting element 310 and the first driving coil 322-1 for opening a contact point of the first fast switching contact point 324-1.

Referring back to FIG. 7, operation of circuit will be further explained. The superconducting element 310 is quenched if an over current occurs due to accidents such as thunderstroke, earth fault and short circuit to generate a high resistance, such that the over-current is divided into 'b-1' path (a first dividing path) having a relatively low impedance value and 'b-2' path (a second dividing path). The first driving coil 322-1 located in 'b-1' path generates an electronic repulsive force in response to the over-current, and a contact point of the first fast-switching contact point 324-1 is opened by the electronic repulsive force. Herein, because the first fast-switching contact point 324-1 is serially connected to the superconducting element 310 and thus the superconducting element 310 divides the over-current into the 'b-1' path and the 'b-2' path, an arc having a relatively low value is generated and a residual over current of 'a' path (power supply path) is restricted as much as a predetermined value by the resistance of the arc.

On the other hand, the second driving coil 322-2 located in the 'b-2' path generates an electronic repulsive force in response to the over-current, and a contact point of the second high speed switching contact point 324-2 is opened by the electronic repulsive force. Herein, the second high speed switching contact point 324-2 is serially connected to the second driving coil 322-2 and generates an arc larger than the one generated from the first high speed switching contact point 324-1, whereby the over current of 'd' path is restricted as much as a predetermined value by an arc resistance of the arc.

In addition, a current conduction path where the over current flows into the system 350 in response to an arc generated by the second high speed switching contact point 324-2 is generated to allow the over current to flow into 'd' path. If a contact point of the first high speed switching contact point 324-1 is opened by a predetermined interval, a contact point of the arc changeover switch 326 is contacted, and thus a small sized arc generated in the first high speed switching contact point 324-1 is divided into 'c', path and simultaneously extinguished, and then the superconducting element 310 is completely separated from the over-current.

That is, the superconducting element 310 is separated from the over current to enjoy a lead time to be restored to a superconducting state within a half period of electric power. Accordingly, the superconducting element 310 can be used in an electric power system that adopts a re-closing breaker which breaks the connection with the system 350 and then re-connects within a predetermined time according to a control signal generated by an over current relay.

On the other hand, a large sized arc generated by the second high speed switching contact point 324-2 is extinguished in a case that it reaches a current null point in a half period of the electric power, and then the over current flows into a current limit load 330 and thus is restricted by the current limit load 330. That is, the operation of current limit starts past a half period of electric power as depicted in FIG. 3.

A difference between the half-wave repulsion type superconducting fault-current limiter of FIG. 3 and the half-wave repulsion type superconducting fault-current limiter of FIG. 7 is that in case of FIG. 3, the arc generated by the high speed switching contact point 324 is extinguished in an event that it reaches a half period of electric power and a current null point, and thus the superconducting element 310 is completely separated from the over-current past the half period, whereas in FIG. 7, the over-current is completely separated from the superconducting element 310 within a half period by the integral high speed-switch module 320 integrally including the first fast switching contact point 324-1, the first driving coil 322-1 the second driving coil 322-2, the second fast switching contact point 324-2 and the arc changeover switch 326, and thus the superconducting element 310 has more time to be restored to a superconducted condition in a case that the circuit breaker 340 closes again in an electric power system that adopts the circuit breaker 340 which performs the re-closing operation within one second.

That is, the superconducting element 310 is separated from the over-current more rapidly because it needs a predetermined time to be restored to a superconducted state.

Figure 8:
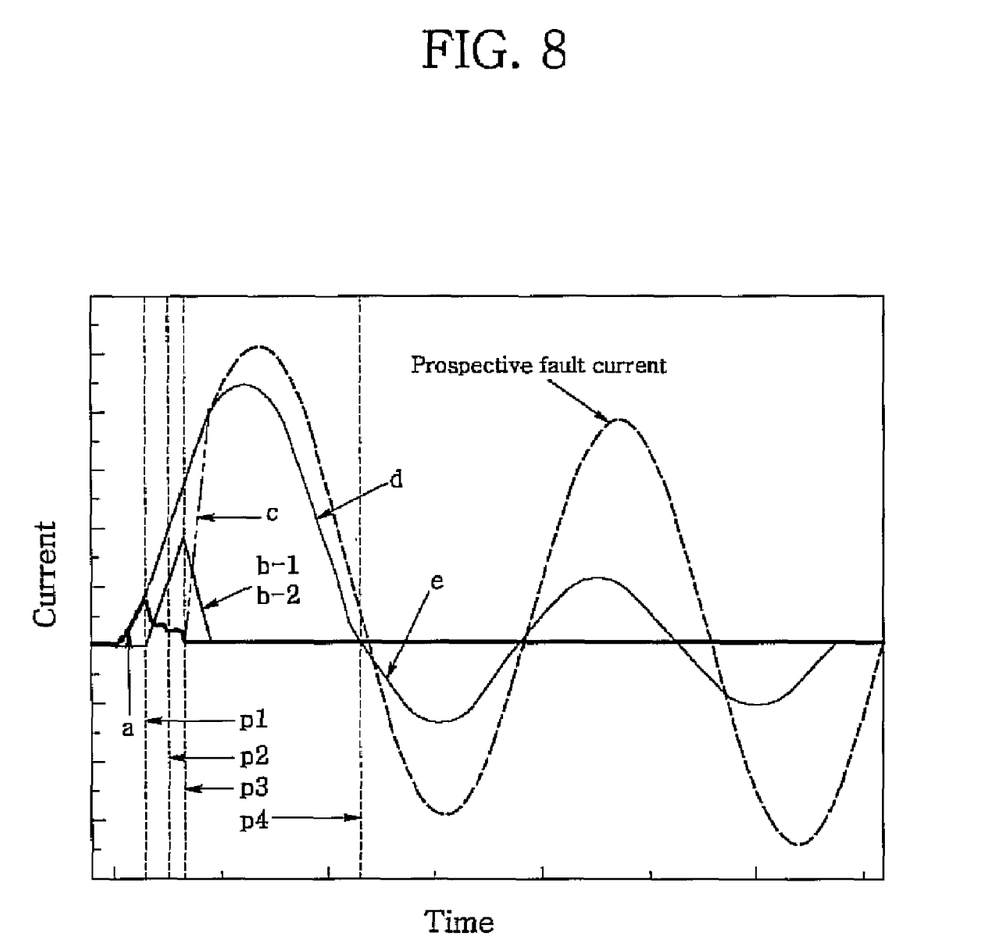
FIG. 8 is a graph showing a transition of over current in accordance with lapse of time in case of generation of the over current.

FIG. 8 is a graph showing a transition of over current in accordance with lapse of time in case of generation of the over current.

A quench phenomenon generating a high resistance value occurs in the superconducting element 310 which in turn is transmitted to a phase transition state in a case that an over current more than a threshold value is generated by accidents such as thunder-stroke, earth fault and short circuit, and then the over current is divided by the generated resistance value (P1 point) into 'b-1' path (a first dividing path) having a relatively low impedance value and 'b-2' path (a second dividing path).

The first driving coil 322-1 located in 'b-1' path generates an electronic repulsive force in response to the over-current, a contact point of the first high speed switching contact point 324-1 is opened by the electronic repulsive force and then an arc having a relatively low value is generated.

The second driving coil 322-2 located in the 'b-2' path generates an electronic repulsive force in response to the over-current, and a contact point of the second fast-switching contact point 324-2 is opened by the electronic repulsive force, and then generates an arc larger than the one generated by the first fast-switching contact point 324-1.

The over current of 'a' and 'd' paths is restricted as much as a predetermined value by the resistance of the arc generated by the first high speed switching contact point 324-1 and the second fast-switching contact point 324-2 (P2 point).

If a contact point of the first high speed switching contact point 324-1 is opened as much as a predetermined interval, an opened contact point of the arc changeover switch 326 is shorted, a 'c' path (current limit path) is connected, and thus an arc of a small value is generated from the first fast-switching contact point 324-1 and is simultaneously extinguished. Then, the superconducting element 310 is completely separated from the over-current (P3 point). The separation interval of the arc changeover switch 326 determines connection time of the 'c' path.

An arc of a large value generated in the second fast-switching contact point 324-2 is extinguished in a case that it reaches a current null point in a half period of electric power, and all the over current flows into the current limit load 330 (P4 point). The over-current that has flown to the current limit load 330 is restricted by a calculated impedance value of the current limit load 330. On the other hand, the circuit breaker 340 breaks the connection with the system 350 by opening a switch in response to a signal generated by an over-current relay.

As illustrated in the graph of FIG. 8, when an abnormal high current or an over current is generated by accidents such as thunder-stroke, earth fault and short circuit, the over-current is restricted past a half period of electric power supplied from the power feeder 300 through the half-wave expulsion type fault-current limiter to allow the over-current relay to control a circuit breaker by detecting the over-current.

Although a few embodiments of the present invention have been shown and described, it would be appreciated by those skilled in the art that changes might be made in these embodiments without departing from the principles and spirit of the invention, the scope of which is defined in the claims and their equivalents.

As apparent from the foregoing, a half-wave expulsion type fault-current limiter in accordance with the present invention can be in harmony with electric power appliances on a system by restricting an over-current past a half period in a case that the over current more than a threshold value is generated by accidents such as thunder-stroke, earth fault and short circuit, by forming a superconducting element, an integral high speed switch module and a current limit load in a hybrid type circuit. In addition, in the half-wave expulsion type superconducting fault-current limiter, manufacturing cost and cooling cost of superconducting elements are reduced due to use of minimum superconducting elements. As a result, a half-wave expulsion type fault-current limiter with reliability can be embodied and a stable electric power can be supplied to a system. Furthermore, current limiting loads and power appliances certified and applied so far are used to enable an easy maintenance. Further advantage is that the superconducting elements can be connected in parallel even in a large power system according to a required power capacity, and the power appliances such as breakers can be appropriately used for application to the present invention.

What is claimed is:

1. A half wave expulsion (non-fault current limiting) type superconducting fault-current limiter comprising an integral high speed switch module, wherein the module comprises: a driving coil arranged on a current-dividing path connected in parallel to superconducting elements on a power supply path for generating an electronic repulsive force when an over-current divided by quench of superconducting elements is applied and then supplying the electronic repulsive force to inter-working means; a high speed switching contact point connected in series between the driving coil and a system, located on a rear terminal of the current dividing path, and integrally axially coupled to the inter-working means to allow a contact point contacting the switch to be opened by an electronic repulsive force supplied to the inter-working means; and an arc changeover switch arranged on a current limit path by being connected in parallel to the driving coil, and one side of which is integrally and axially coupled to the inter-working means, while being inter-worked in a moving direction and an opposite direction of the high speed switching contact point, and supplying the over-current to a current limit load connected in series to a rear terminal thereof through the contact point when the high speed switching contact point is opened as much as a predetermined interval.

2. The limiter as defined in claim 1, wherein a contact point separation interval of the arc changeover switch is less than that of the high speed switching contact point, such that the contact point of the arc changeover switch is contacted earlier than a time when the high speed switching contact point is completely detached.

3. The limiter as defined in claim 1, wherein the inter-working means is located on an upper side of the driving coil and is a plate-shaped repulsive plate activated by an electronic repulsive force generated by the over current supplied to the driving coil.

4. The limiter as defined in claim 3, wherein a contact point of the arc changeover switch is connected so as be inter-worked with an upper end of the repulsive plate, and a contact point of the high speed switching contact point is connected so as to be inter-worked with a lower end of the repulsive plate.

5. The limiter as defined in claim 1, wherein the high speed switching contact point is at least one of the high speed switching contact points serially connected.

6. A half-wave expulsion type superconducting fault-current limiter having an integral high speed switch module comprising:
   a first high speed switching contact point serially connected between a superconducting element and a system on a power supply path;
   a first driving coil connected in parallel to the superconducting element and the first fast switching contact point and arranged on a first dividing path, and generating an electronic repulsive force by an over-current divided by the superconducting element to detach a contact point of the first high speed switching contact point;
   a second driving coil connected in parallel to the first driving coil and arranged on a second dividing path to generate an electronic repulsive force in response to the over current;
   a second high speed switching contact point serially connected between the first driving coil, the second driving coil and the system, and located on a rear end of the first dividing path and the second dividing path, and having a contact point detached by an electronic repulsive force generated by the second driving coil; and
   an arc changeover switch arranged on a current limit path by being connected in parallel to the second driving coil, and supplying the over current to a current limit load serially connected to its rear end through the opening of the contact point in a case that the fast switching contact point is opened by a predetermined interval.

* * * * *